(12) United States Patent
Yang et al.

(10) Patent No.: US 11,581,807 B2
(45) Date of Patent: Feb. 14, 2023

(54) CHARGE PUMP DEVICE

(71) Applicant: REALTEK SEMICONDUCTOR CORPORATION, Hsinchu (TW)

(72) Inventors: Jun Yang, Suzhou (CN); Jia-Ning Lou, Suzhou (CN)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 17/326,396

(22) Filed: May 21, 2021

(65) Prior Publication Data

US 2022/0077774 A1 Mar. 10, 2022

(30) Foreign Application Priority Data

Sep. 10, 2020 (CN) .......................... 202010949721.2

(51) Int. Cl.
*H02M 3/07* (2006.01)
*H03L 7/08* (2006.01)

(52) U.S. Cl.
CPC .............. *H02M 3/07* (2013.01); *H03L 7/08* (2013.01)

(58) Field of Classification Search
CPC .............................. H02M 3/07; H02M 1/0083
See application file for complete search history.

(56) References Cited

U.S. PATENT DOCUMENTS

| 7,733,136 | B2 | 6/2010 | Chen et al. | |
|---|---|---|---|---|
| 2009/0010041 | A1* | 1/2009 | Afghahi | G11C 29/028 |
| | | | | 365/207 |
| 2010/0188156 | A1* | 7/2010 | Arai | H03B 5/366 |
| | | | | 331/15 |
| 2013/0120040 | A1* | 5/2013 | Zhong | H03L 7/0893 |
| | | | | 327/156 |
| 2017/0250693 | A1* | 8/2017 | Jan | H03L 7/0895 |
| 2017/0288531 | A1* | 10/2017 | Ribeiro do Nascimento | |
| | | | | H02M 3/07 |

FOREIGN PATENT DOCUMENTS

| CN | 101335521 A | 12/2008 |
|---|---|---|
| TW | 200919978 A | 5/2009 |

OTHER PUBLICATIONS

OA letter of the counterpart TW application (appl. No. 109136673) mailed on Jun. 30, 2021. Summary of the OA letter: 1.Claims 1-2 are rejected as allegedly being unpatentable over the cited reference (TW200919978 A;also published as US7733136B2). 2.Claims 3-10 are allowable.

\* cited by examiner

*Primary Examiner* — Sibin Chen
(74) *Attorney, Agent, or Firm* — WPAT, PC

(57) ABSTRACT

A charge pump device includes first to third current source circuits, a first switch, and a second switch. The first current source circuit is implemented with a first type transistor, and provides a first current to an output node. The first switch is selectively turned on according to a first control signal. When the first switch is turned on, the second current source circuit drains a second current from the output node. The second switch is selectively turned on according to a second control signal. Each of the first switch and the second switch is implemented with a second type transistor, and a withstand voltage of the first type transistor is higher than a withstand voltage of the second type transistor. When the second switch is turned on, the third current source circuit drains a third current from the output node.

20 Claims, 6 Drawing Sheets

CHARGE PUMP DEVICE

BACKGROUND

1. Technical Field

The present disclosure relates to a charge pump device. More particularly, the present disclosure relates to a charge pump device that has high output voltage range and is able to be applied in a high-speed application.

2. Description of Related Art

A charge pump device may be a circuit for controlling a clock generator circuit. The charge pump device is configured to generate a corresponding current according to an output signal of a detector circuit. In order to support a tuning range of a voltage-controlled oscillator circuit, the current generated from the charge pump device is required to have wider output range. On the other hand, in order to be suitable for a high-speed clock generator circuit, the charge pump device is required to have a higher operating speed. However, there is a trade-off between the output range and the operating speed in circuit design of current approaches. In other words, if the charge pump device has a higher output range, the operating speed of the charge pump device is slower, and is thus not suitable for high-speed applications. Alternatively, if the charge pump device has a faster operating speed, the output range of the charge pump device is narrower, and is thus not able to meet the tuning range of the voltage-controlled oscillator circuit.

SUMMARY

In some aspects of the present disclosure, a charge pump device includes current source circuits, a first switch, and a second switch. The current source circuits include a first current source circuit, a second current source circuit, and a third current source circuit. The first current source circuit is configured to provide a first current to an output node, and is implemented with a first type of transistor. The first switch is configured to be selectively turned on according to a first control signal. When the first switch is turned on, the second current source circuit is configured to drain a second current from the output node. The second switch is configured to selectively turned on according to a second control signal. Each of the first switch and the second switch is implemented with a second type of transistor, a withstand voltage of the first type of transistor is higher than a withstand voltage of the second type of transistor, and when the second switch is turned on, the third current source circuit is configured to drain a third current from the output node.

These and other objectives of the present disclosure will be described in preferred embodiments with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
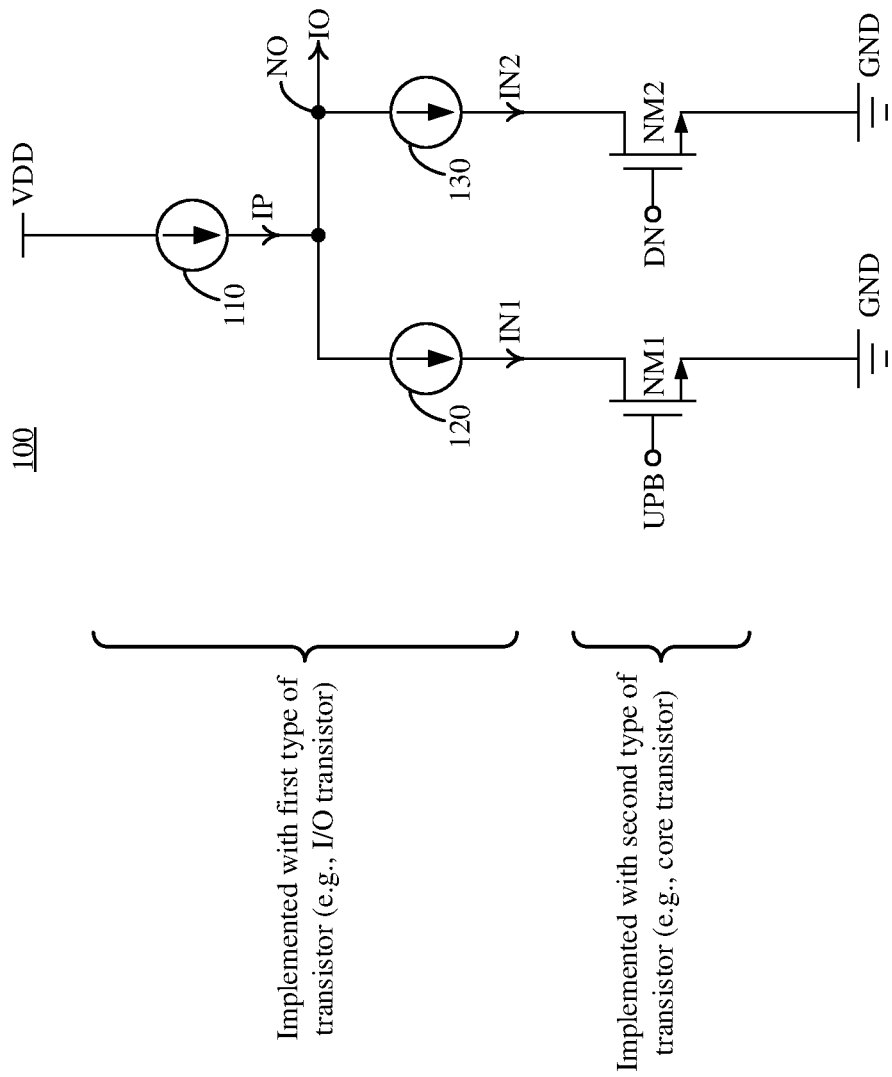
FIG. 1 is a schematic diagram of a charge pump device according to some embodiments of the present disclosure.
Figure 3:
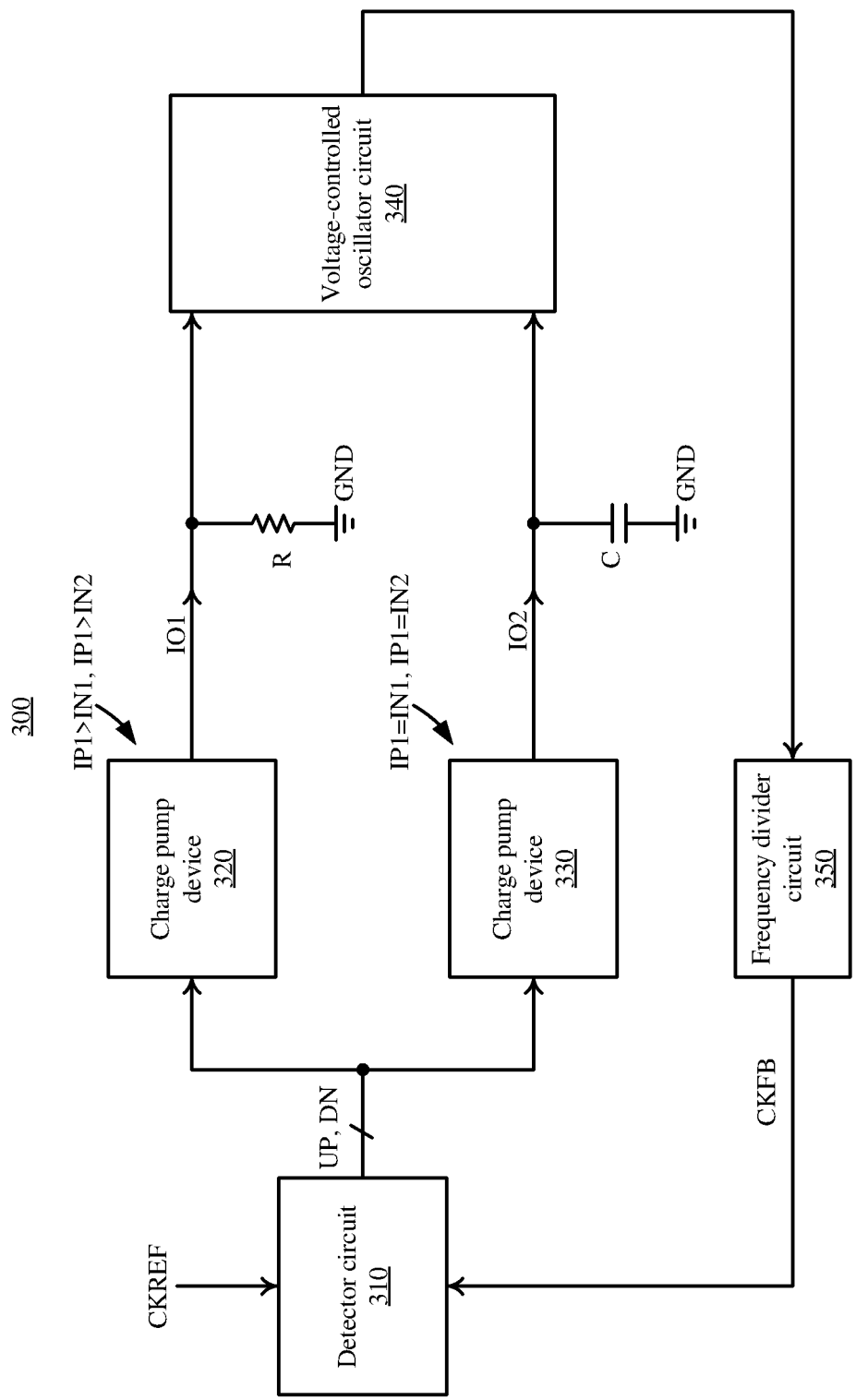
FIG. 3 is a schematic diagram of a phase locked loop device according to some embodiments of the present disclosure.

FIG. 1 is a schematic diagram of a charge pump device 100 according to some embodiments of the present disclosure. In some embodiments, as shown in FIG. 3, the charge pump device 100 may be applied to a phase locked loop device. In some embodiments, as shown in FIG. 4, the charge pump device 100 may be applied to a clock and data recovery device.

The charge pump device 100 includes a current source circuit 110, a current source circuit 120, a current source circuit 130, a switch NM1, and a switch NM2. A terminal of the current source circuit 110 is configured to receive a supply voltage VDD, and another terminal of the current source circuit 110 is coupled to an output node NO. The current source circuit 110 is configured to provide a current IP to the output node NO.

In this example, the current source circuit 120 and the current source circuit 130 are coupled in parallel and between the output node NO and ground GND. In greater detail, the current source circuit 120 is coupled to the ground GND via the switch NM1, and the current source circuit 130 is coupled to the ground GND via the switch NM2. The switch NM1 is configured to be selectively turned on according to a control signal UPB, and the switch NM2 is configured to be selectively turned on according to a control signal DN. When the switch NM1 is turned on, the current source circuit 120 is configured to drain a current IN1 from the output node NO. When the switch NM2 is turned on, the current source circuit 130 is configured to drain a current IN2 from the output node NO.

Figure 4:
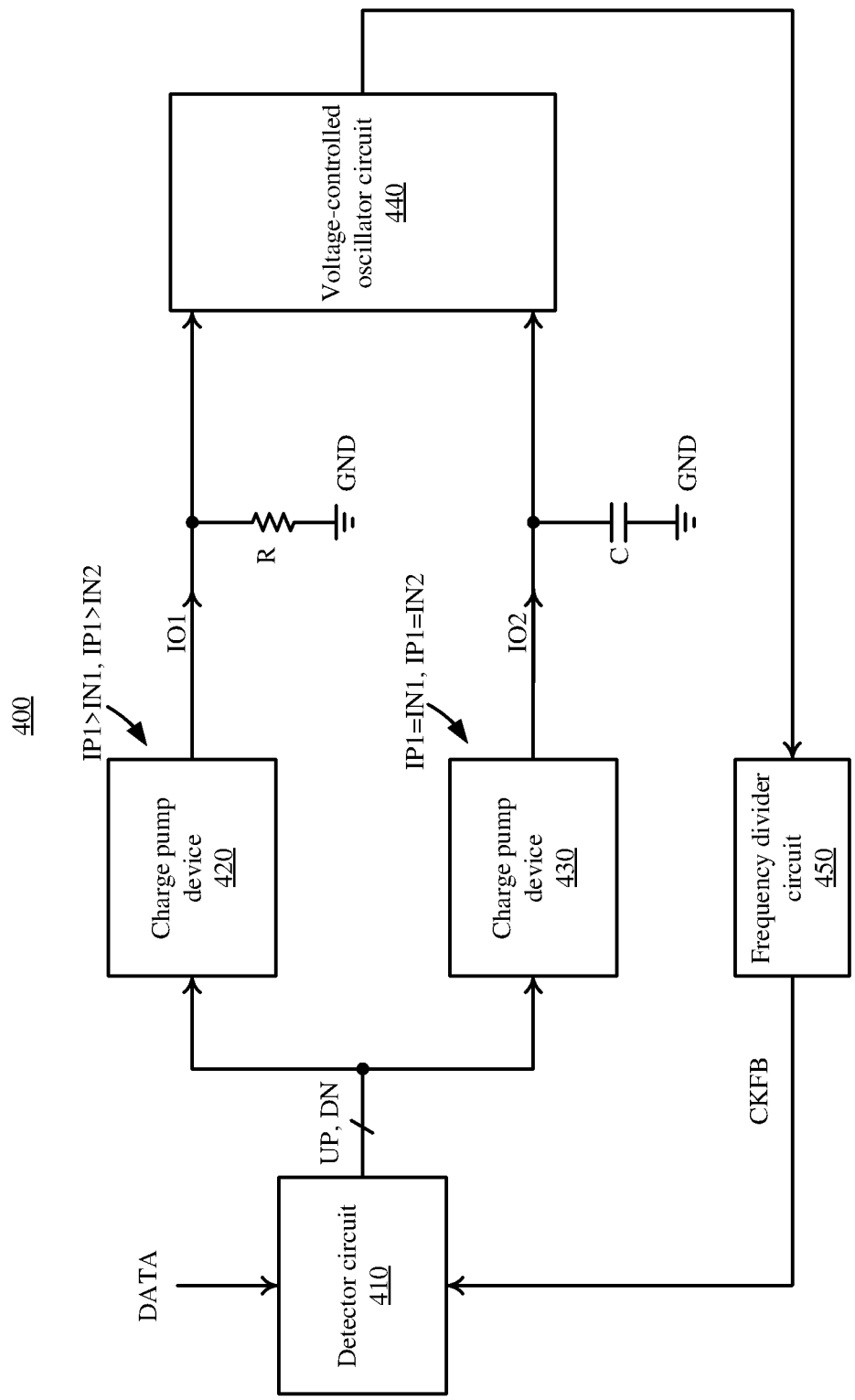
FIG. 4 is a schematic diagram of a clock and data recovery device according to some embodiments of the present disclosure.

In some embodiments, the control signal UPB and the control signal DN are associated with output signals of a phase detector circuit (which may be, for example, a detector circuit 320 in FIG. 3 or a detector circuit 420 in FIG. 4). For example, an output signal (e.g., a control signal UP in FIG. 3 or 4) of the phase detector circuit is for indicating a phase lead of a signal being detected (e.g., a clock signal CKREF in FIG. 3 or a data signal DATA in FIG. 4), and another output signal (e.g., a control signal DN in FIG. 3 or 4) of the phase detector circuit is for indicating a phase lag of the signal being detected. In some embodiments, the control signal UPB and the control signal UP have opposite levels. In other words, if the control signal UP has a low level (e.g., logic value of 0), and the control signal UPB has a high level (e.g., logic value of 1). If the control signal UP has the high level, the control signal UPB has the low level. In some embodiments, the charge pump device 100 may further includes an inverter circuit (not shown), which is configured to generate the control signal UPB according to the control signal UP.

In some embodiments, the output node NO is configured to output a current IO. The current IO may be converted to be a voltage signal by other components (e.g., a resistor R in FIG. 3 or 4 or a resistor Ro in FIG. 6, and/or a capacitor Co in FIG. 6), in order to control a voltage-controlled oscillator circuit. In some embodiments, relations among the current IO, the current IP, the current IN1, the current IN2, the control signal UP (or the control signal UPB), and the control signal DN may be listed as the following table:

| control signal UP (opposite to control signal UPB) | control signal DN | current IO |
|---|---|---|
| 0 | 0 | IP-IN1 |
| 0 | 1 | IP-IN1-IN2 |
| 1 | 0 | IP |
| 1 | 1 | IP-IN2 |

When the control signal UP and the control signal DN have logic values of 0, the switch NM1 is turned on, and the switch NM2 is not turned on. Under this condition, the current IO is the current IP minus the current IN1 (i.e., IO=IP−IN1). When the control signal UP has the logic value of 0 and the control signal DN has the logic value of 1, the switch NM1 and the switch NM2 are all turned on. Under this condition, the current IO is the current IP minus a sum of the current IN1 and the current IN2 (i.e., IO=IP−IN1−IN2). When the control signal UP has the logic value of 1 and the control signal DN has the logic value of 0, the switch NM1 and the switch NM2 are not turned on. Under this condition, the current IO is equal to the current IP. When the control signal UP and the control signal DN have the logic values of 1, the switch NM1 is not turned on, and the switch NM2 is turned on. Under this condition, the current IO is the current IP minus the current IN2 (i.e., IO=IP−IN2).

In some embodiments, each of the current source circuit 110, the current source circuit 120, and the current source circuit 130 is implemented by a first type of transistor, and each of the switch NM1 and the switch NM2 is implemented by a second type of transistor, in which a withstand voltage of the first type of transistor is higher than that of the second type of transistor. For example, the first type of transistor may be an I/O (input/output) transistor, and the second type of the transistor may be a core transistor. In general, the I/O transistor has a higher withstand voltage, and is commonly employed to implement an I/O interface circuit. The core transistor has a lower threshold voltage, and thus has a higher operating speed, and is commonly employed to implement a main circuit in a chip.

With the above configuration, the supply voltage VDD may be set to be a high supply voltage that may be withstood by the first type of transistor (e.g., I/O transistor). As a result, the current IO may have higher output range, such that the aforementioned voltage signal may have higher voltage range. Furthermore, as the switch NM1 and the switch NM2 are implemented by the second type of transistor (e.g., core transistor), levels of the control signal UPB and the control signal DN may be set to be levels in a low voltage domain. As a result, the switch NM1 and the switch NM2 may have a higher transiting speed. Accordingly, the charge pump device 100 may generate the signal having wide output range and may be suitable for a high-speed application. Moreover, the current source circuit 120 and the current source circuit 130 may tolerate a voltage drop from the supply voltage VDD for the switch NM1 and the switch NM2 respectively, and thus the reliability of the switch NM1 and the switch NM2 are increased. Detailed descriptions about herein are given for illustrative purposes with reference to FIG. 2. The types of the first type of transistor and those of the second type of transistor are given for illustrative purposes, but the present disclosure is not limited thereto.

Figure 2:
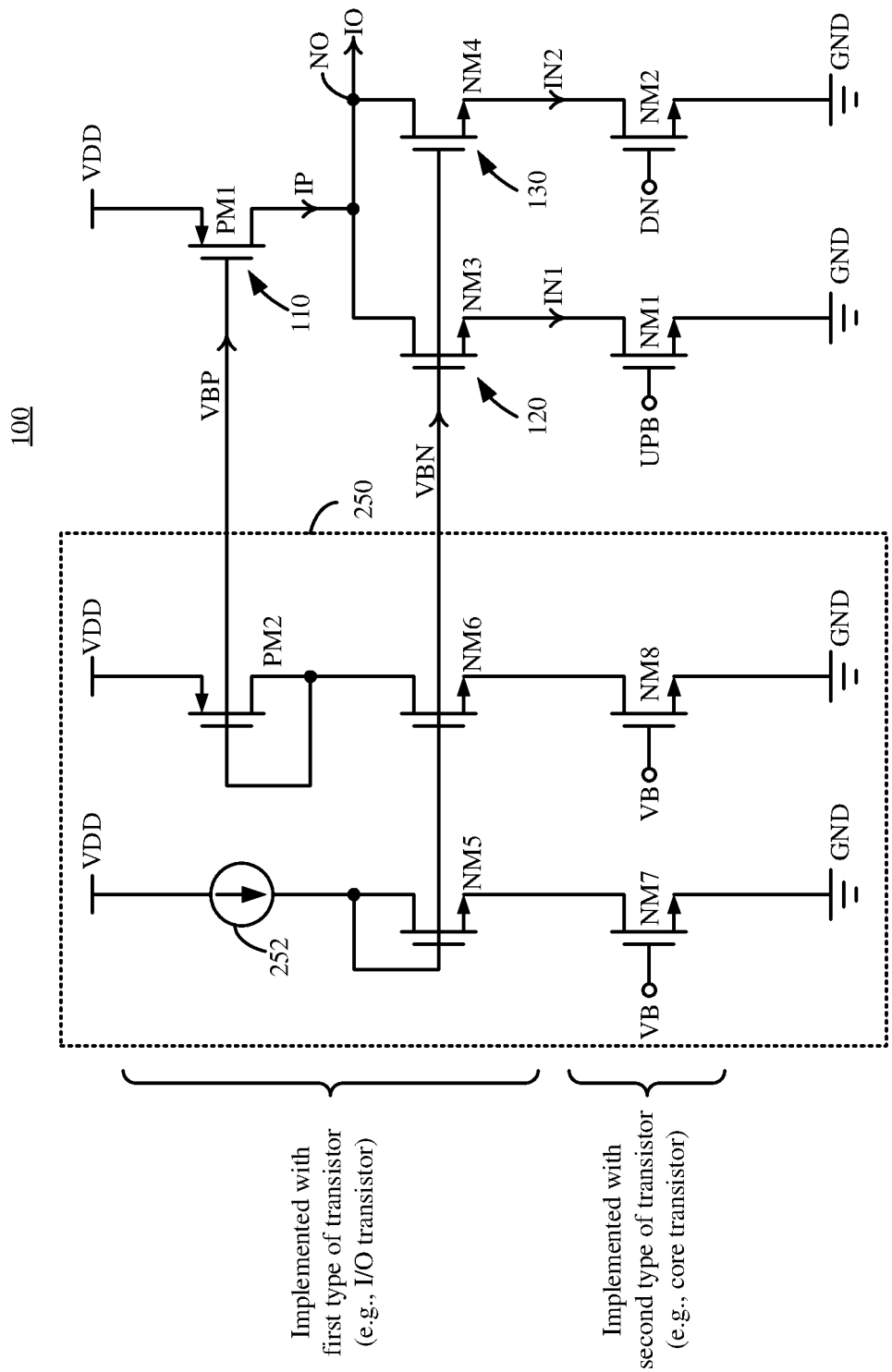
FIG. 2 is a circuit diagram of the charge pump device in FIG. 1 according to some embodiments of the present disclosure.

FIG. 2 is a circuit diagram of the charge pump device 100 in FIG. 1 according to some embodiments of the present disclosure. In this example, the current source circuit 110 includes a transistor PM1, the current source circuit 120 includes a transistor NM3, and the current source circuit 130 includes a transistor NM4. A first terminal (e.g., source) of the transistor PM1 is configured to receive the supply voltage VDD, a second terminal (e.g., drain) of the transistor PM1 is coupled to the output node NO and configured to output the current IP, and a control terminal (e.g., gate) of the transistor PM1 is configured to receive a bias voltage VBP. The transistor PM1 is configured to generate the current IP according to the bias voltage VBP. First terminals (e.g., drain) of the transistor NM3 and the transistor NM4 are coupled to the output node NO, in order to drain the current IN1 and the current IN2 respectively. Second terminals (e.g., source) of the transistor NM3 and the transistor NM4 are coupled to first terminals of the switch NM1 and the switch NM2 respectively, and control terminals (e.g., gate) of the transistor NM3 and the transistor NM4 are configured to receive a bias voltage VBN. The transistor NM3 and the transistor NM4 are configured to respectively generate the current IN1 and the current IN2 according to the bias voltage VBN. Second terminals of the switch NM1 and the switch NM2 are coupled to the ground GND, and control terminals of the switch NM1 and the switch NM2 receive the control signal UPB and the control signal DN respectively.

In this example, the charge pump device 100 further includes a bias circuit 250. The bias circuit 250 is configured to generate the bias voltage VBP to bias the current source circuit 110, and to generate the bias voltage VBN to bias the current source circuit 120 and the current source circuit 130. In some embodiments, the bias circuit 250 is configured to simulate connections among the current source circuit 110, the current source circuit 120, the current source circuit 130, the switch NM1, and the switch NM2, in order to generate the bias voltage VBP and the bias voltage VBN. For example, the bias circuit 250 includes a current source circuit 252, a transistor PM2, and transistors NM5-NM8, in which each of the current source circuit 252, the transistor PM2, the transistor NM5, and the transistor NM6 is implemented with the first type of transistor, and each of the transistor NM7 and the transistor NM8 is implemented with the second type of transistor. A first terminal of the current source circuit 252 is configured to receive the supply voltage VDD. A first terminal and a control terminal of the transistor NM5 are coupled to a second terminal of the current source circuit 252, in order to generate the bias voltage VBN. A first terminal of the transistor NM7 is coupled to a second terminal of the transistor NM5, a second terminal of the transistor NM7 is coupled to the ground GND, and a control terminal of the transistor NM7 receives a voltage VB. A first terminal of the transistor PM2 is configured to receive the supply voltage VDD, and a second terminal and a control terminal of the transistor PM2 are coupled to a first terminal of the transistor NM6 to generate the bias voltage VBP. A second terminal of the transistor NM6 is coupled to a first terminal of the transistor NM8, and a control terminal of the transistor NM6 is configured to receive the bias voltage VBN. A second terminal of the transistor NM8 is coupled to the ground GND, and a control terminal of the transistor NM8 is configured to receive the voltage VB.

As shown in FIG. 2, a connection among the transistor PM2, the transistor NM6, and the transistor NM8 (or the current source circuit 252, the transistor NM5, and the transistor NM7) is similar to a connection among the transistor PM1, the transistor NM3, and the switch NM1, and is similar to a connection among the transistor PM1, the transistor NM4, and the switch NM2. In some embodiments, a size of the transistor PM2 and a size of the transistor PM1 may have therebetween, a size of the transistor NM6 and a size of the transistor NM3 (and/or the transistor NM4) may have a predetermined ratio therebetween, and a size of the transistor NM8 and a size of the switch NM1 (and/or the switch NM2) have may have a predetermined ratio therebetween. As a result, the transistor PM2, the transistor NM6, and the transistor NM8 may simulate operating conditions of the transistor PM1, the transistors NM3-NM4, and the switch NM1-NM2, in order to generate the bias voltage VBP and the bias voltage VBN that are more accurate.

In some embodiments, the bias voltage VBN is configured to limit the voltage on the first terminals of the transistor NM7, the transistor NM8, the switch NM1, and the switch NM2 not to exceed a withstand voltage of the second type of transistor. For example, if the withstand voltage of the second type of transistor is a first voltage, by adjusting the sizes of the transistors NM3-NM6, the bias voltage VBN may be set to be equal to (or lower than) the first voltage. As a result, the voltage on the first terminals of the transistor NM7, the transistor NM8, the switch NM1, and the switch NM2 may be lower than or equal to the first voltage. Equivalently, the transistor NM3, the transistor NM4, the transistor NM5, and the transistor NM6 withstand the voltage drop from the supply voltage VDD for the switch NM1, the switch NM2, the transistor NM7, and the transistor NM8 respectively. As a result, it is able to prevent the transistor NM7, the transistor NM8, the switch NM1, and the switch NM2 that are implemented with the second type of transistor from being damaged.

The configurations between the bias voltage VBN and the withstand voltage (i.e., the first voltage) of the second type of transistor are given for illustrative purposes, and the present disclosure is not limited thereto. The configurations of the current source circuit 110, the current source circuit 120, and the current source circuit 130 are given for illustrative purposes, and the present disclosure is not limited thereto. In some other embodiments, each of the current source circuit 110, the current source circuit 120, and the current source circuit 130 may have stacked transistors.

In some embodiments, the current IN1 may be equal to the current IN2. In some different embodiments, the current IP may be higher than or equal to at least one of the current IN1 and the current IN2. The above configurations among the current IN1, the current IN2, and the current IP may be adjusted according to practical requirements.

FIG. 3 is a schematic diagram of a phase locked loop device 300 according to some embodiments of the present disclosure. The phase locked loop device 300 includes a detector circuit 310, a charge pump device 320, a charge pump device 330, a voltage-controlled oscillator circuit 340, a frequency divider circuit 350, a resistor R, and a capacitor C. In some embodiments, the detector circuit 310 may be a phase detector circuit, a frequency detector circuit, and/or a phase frequency detector circuit, which is configured to compare the clock signal CKREF with a clock signal CKFB from the frequency divider circuit 350, in order to generate the control signal UP and the control signal DN. The charge pump device 320 generates a current IO1 according to the control signal UP and the control signal DN and transmits the same to the resistor R, in order to generate a signal for controlling the voltage-controlled oscillator circuit 340. The charge pump device 330 generates a current IO2 according to the control signal UP and the control signal DN and transmits the same to the capacitor C, in order to generate another signal for controlling the voltage-controlled oscillator circuit 340. In this example, each of the charge pump device 320 and the charge pump device 330 may be implemented with the charge pump device 100 in FIG. 1 or FIG. 2. In the charge pump device 320, a current IP1 (e.g., the current IP in FIG. 1 or FIG. 2) may be, but not limited to, set to be higher than the current IN1 and the current IN2. As a result, the current IO1 outputted from the charge pump device 320 may be prevented from being a negative current. In the charge pump device 330, the current IP1 (e.g., the current IP in FIG. 1 or FIG. 2) may be, but not limited to, set to be equal to the current IN1 and the current IN2.

FIG. 4 is a schematic diagram of a clock and data recovery device 400 according to some embodiments of the present disclosure. The clock and data recovery device 400 includes a detector circuit 410, a charge pump device 420, a charge pump device 430, a voltage-controlled oscillator circuit 440, a frequency divider circuit 450, a resistor R, and a capacitor C. In some embodiments, the detector circuit 410 may be a phase detector circuit, a frequency detector circuit, and/or a phase frequency detector circuit, which is configured to compare the data signal DATA and a clock signal CKFB from the frequency divider circuit 450, in order to generate the control signal UP and the control signal DN. The charge pump device 420 generates the current IO1 according to the control signal UP and the control signal DN, and transmits the same to the resistor R, in order to generate a signal for controlling the voltage-controlled oscillator circuit 440. The charge pump device 430 generates the current IO2 according to the control signal UP and the control signal DN, and transmits the same to the capacitor C, in order to generate another signal for controlling the voltage-controlled oscillator circuit 440. In this example, each of the charge pump device 420 and the charge pump device 430 may be implemented with the charge pump device 100 in FIG. 1 or FIG. 2. Similar to examples of FIG. 3, in the charge pump device 420, the current IP1 (e.g., the current IP in FIG. 1 or FIG. 2) may be, but not limited to, set to be higher than the current IN1 and the current IN2, in order to prevent the current IO1 from being a negative current. In the charge pump device 430, the current IP1 (e.g., the current IP in FIG. 1 or FIG. 2) may be, but not limited to, set to be equal to the current IN1 and the current IN2.

Figure 5:
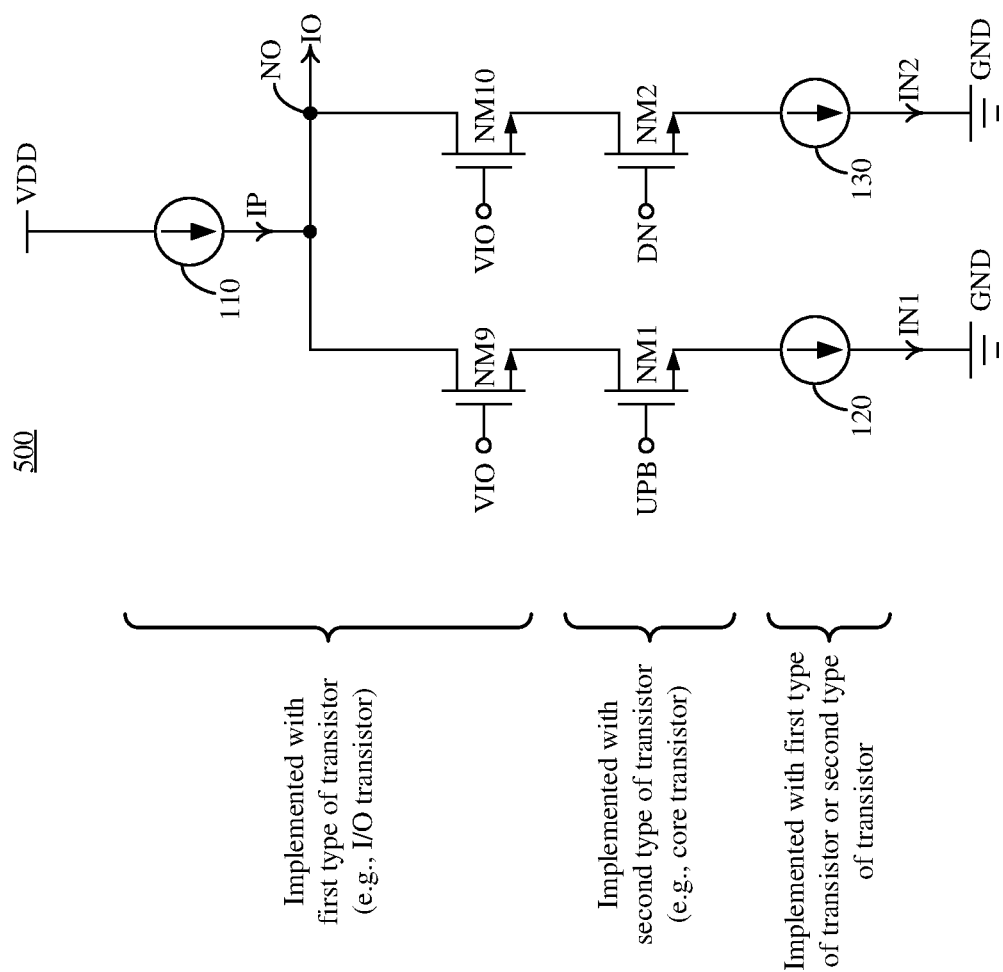
FIG. 5 is a schematic diagram of the charge pump device according to some embodiments of the present disclosure.

FIG. 5 is a schematic diagram of the charge pump device 500 according to some embodiments of the present disclosure. Compared with the charge pump device 100 in FIG. 1 or FIG. 2, the charge pump device 500 further includes a transistor NM9 and a transistor NM10, and the switch NM1 and the switch NM2 are coupled to the ground GND via the current source circuit 120 and the current source circuit 130 respectively. The transistor NM9 is coupled between the output node NO and the switch NM1. The transistor NM10 is coupled between the output node NO and the switch NM2. The transistor NM9 and the transistor NM10 may be implemented with the first type of transistor. In some embodiments, the current source circuit 120 and the current source circuit 130 in FIG. 5 may be implemented with the first type of transistor. In some other embodiments, the current source circuit 120 and the current source circuit 130 in FIG. 5 may be implemented with the second type of transistor.

In greater detail, a first terminal of the transistor NM9 is coupled to the output node NO, a second terminal of the transistor NM9 is coupled to a first terminal of the switch NM1, and a control terminal of the transistor NM9 is configured to receive a bias voltage VIO. A first terminal of the transistor NM10 is coupled to the output node NO, a second terminal of the transistor NM10 is coupled to a first terminal of the switch NM2, and a control terminal of the transistor NM10 is configured to receive the bias voltage VIO. A second terminal of the switch NM1 is coupled to the ground GND via the current source circuit 120, and a second terminal of the switch NM2 is coupled to the ground GND via the current source circuit 130. As mentioned above, the transistor NM9 and the transistor NM10 receive the bias voltage VIO. Similar to the bias voltage VBN in FIG. 2, the bias voltage VIO may be configured to limit the voltage on the first terminals of the switch NM1 and the switch NM2 not to exceed the withstand voltage of the second type of transistor. For example, if the withstand voltage of the second type of transistor is a first voltage, the bias voltage VIO may be adjusted to be equal to (or less than) the first voltage, but the present disclosure is not limited thereto.

Figure 6:
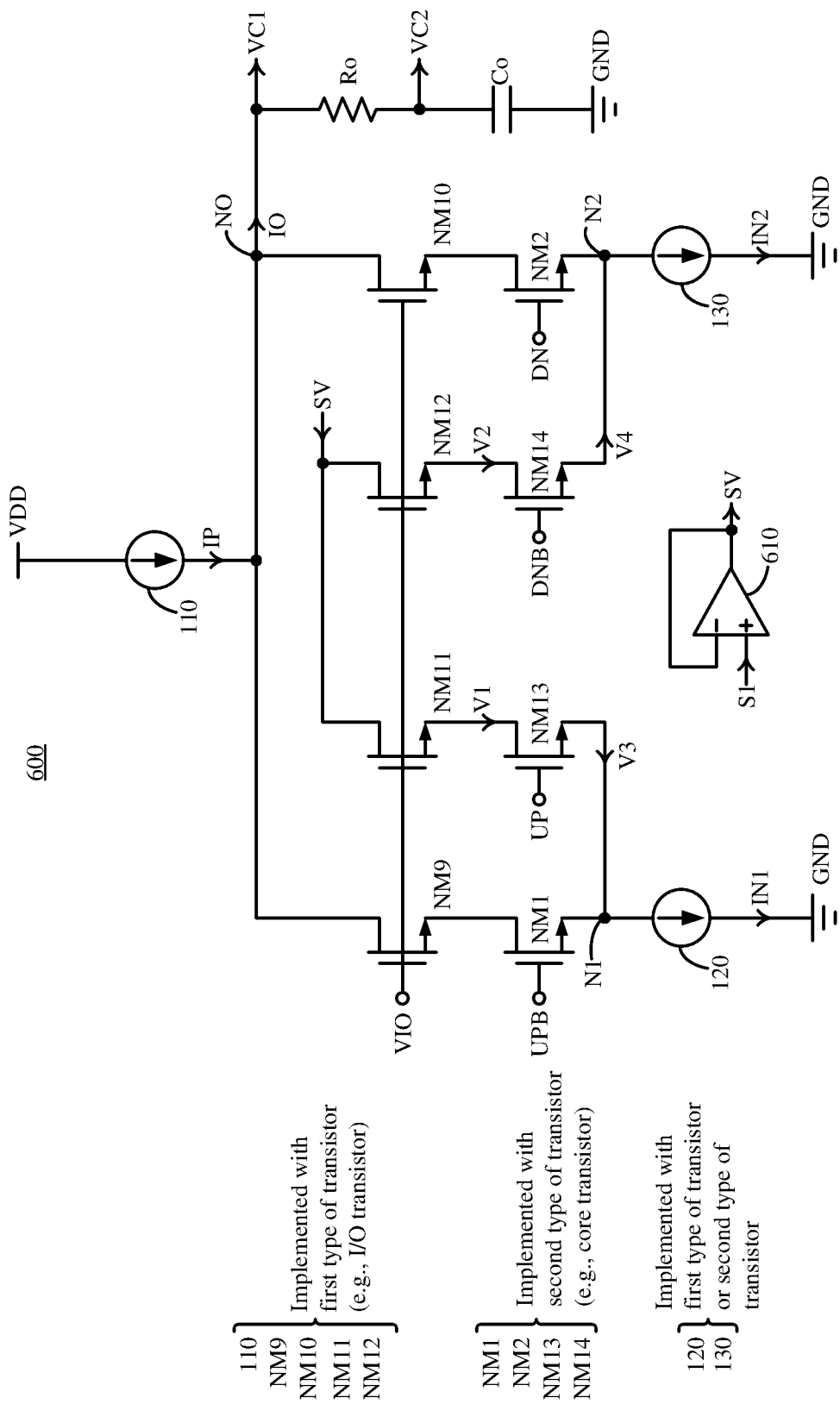
FIG. 6 is a schematic diagram of a charge pump device according to some embodiments of the present disclosure.

FIG. 6 is a schematic diagram of a charge pump device 600 according to some embodiments of the present disclosure. Compared with the charge pump device 500 in FIG. 5, the charge pump device 600 further includes a transistor NM11, a transistor NM12, a switch NM13, a switch NM14, an amplifier circuit 610, a resistor Ro, and a capacitor Co. In this example, the current source circuit 110 and the transistors NM9-NM12 may be implemented with the first type of transistor, the switches NM1-NM2 and the switches NM13-NM14 may be implemented with the second type of transistor, and the current source circuit 120 and the current source circuit 130 may be implemented with the first type of transistor or the second type of transistor.

The transistor NM11 is configured to generate a voltage V1 according to a voltage signal SV and the bias voltage VIO. The transistor NM12 is configured to generate a voltage V2 according to the voltage signal SV and the bias voltage VIO. The switch NM13 is configured to be selectively turned on according to the control signal UP, in order to generate a voltage V3 according to the voltage V1, and to transmit the same to a node N1, in which the node N1 is coupled between the second terminal of the switch NM1 and the current source circuit 120. The switch NM14 is configured to be selectively turned on according to the control signal DNB, in order to generate a voltage V4 according to the voltage V2, and to transmit the voltage V4 to the node N2, in which the node N2 is coupled between the second terminal of the switch NM2 and the current source circuit 130. In some embodiments, the control signal DNB and the control signal DN have opposite levels. In other words, if the control signal DN has the low level, the control signal DNB has the high level. If the control signal DN has the high level, the control signal DNB has the low level.

In greater detail, the first terminals of the transistor NM11 and the transistor NM12 are coupled to an output terminal of the amplifier circuit 610 to receive the voltage signal SV. Control terminals of the transistor NM11 and the transistor NM12 receive the bias voltage VIO. A second terminal of the transistor NM11 is coupled to a first terminal of the switch NM13 to generate the voltage V1. A second terminal of the transistor NM12 is coupled to a first terminal of the switch NM14 to generate the voltage V2. A control terminal of the switch NM13 is configured to receive the control signal UP, and the second terminal of the switch NM13 is coupled to the node N1 and is configured to generate the voltage V3. A control terminal of the switch NM14 is configured to receive the control signal DNB, and a second terminal of the switch NM14 is coupled to the node N2 and is configured to generate the voltage V4. In some embodiments, a size of each of the transistors NM9-NM14 may be, but not limited to, equal to each other. The resistor Ro is coupled to the output node NO to generate an output signal VC1. The capacitor Co is coupled between the resistor Ro and the ground GND, and is configured to generate an output signal VC2. A positive input terminal of the amplifier circuit 610 receives a reference signal S1, a negative input terminal of the amplifier circuit 610 is coupled to an output terminal of the amplifier circuit 610, and the output terminal of the amplifier circuit 610 is configured to output the voltage signal SV. With such arrangements, the amplifier circuit 610 may operate as a unit gain buffer circuit, in order to output the reference signal S1 to be the voltage signal SV.

In some embodiments, the reference signal S1 may be the output signal VC1 or the output signal VC2, but the present disclosure is not limited thereto. In some embodiments, the reference signal S1 may an additional reference voltage. With the above configuration, the level of the node N1 in a time interval of the switch NM1 being turned on may be close to (or equal to) the level of the voltage V3 during a time interval of the switch NM13 being turned on. Similarly, the level of the node N2 during a time interval of the switch NM2 being turned on is close to (or equal to) the level of the voltage V4 during a time interval of the switch NM14 being turned on. As a result, when the switch NM1 is turned off, the switch NM13 is turned in order to output the voltage V3 to the node N1, in order to keep the level of the node N1. Similarly, when the switch NM2 is turned off, the switch NM14 is turned on to output the voltage V4 to the node N2, in order to keep the level of the node N2.

It is understood that, in some embodiments, each of the charge pump device 320 and the charge pump device 330 in FIG. 3 may be implemented with the charge pump device 500 in FIG. 5 or the charge pump device 600 in FIG. 6 as well. Similarly, in some embodiments, each of the charge pump device 420 and the charge pump device 430 in FIG. 4 may be implemented with the charge pump device 500 in FIG. 5 or the charge pump device 600 in FIG. 6.

In the aforementioned one or more embodiments, certain transistors are N-type transistors, and certain transistors are P-type transistors. Each transistor may be implemented with a metal oxide silicon field effect transistor (MOSFET), but the present disclosure is not limited thereto. Various transistors that able to implement the similar operations or various conductivity types of transistors are within the contemplated scope of the present disclosure.

As described above, the charge pump device in some embodiments of the present disclosure utilize high-speed transistor(s) and transistor(s) able to withstand high voltage to achieve a high output range, and is able to be applied in high-speed application(s).

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A charge pump device, comprising:
a plurality of current source circuits comprising a first current source circuit, a second current source circuit, and a third current source circuit, wherein the first current source circuit is configured to continuously provide a first current to an output node, and is implemented with a first type of transistor;
a first switch configured to be selectively turned on according to a first control signal, wherein when the first switch is turned on, the second current source circuit is configured to drain a second current from the output node; and
a second switch configured to be selectively turned on according to a second control signal,
wherein each of the first switch and the second switch is implemented with a second type of transistor, a withstand voltage of the first type of transistor is higher than a withstand voltage of the second type of transistor, and when the second switch is turned on, the third current source circuit is configured to drain a third current from the output node.

2. The charge pump device of claim 1, wherein the first type of transistor is an input/output transistor, and a second type of transistor is a core transistor.

3. The charge pump device of claim 1, wherein the second current source circuit and the third current source are coupled to ground via the first switch and the second switch respectively.

4. The charge pump device of claim 3, wherein each of the second current source circuit and the third current source is implemented with the first type of transistor.

5. The charge pump device of claim 1, wherein the first control signal and a first output signal of a phase detector circuit have opposite levels, the first output signal is for indicating a phase lead, and the second control signal is a second output signal, which is for indicating a phase lag, of the phase detector.

6. The charge pump device of claim 1, further comprising:
a bias circuit configured to generate a first bias voltage to bias the first current source circuit, and configured to generate a second bias voltage to bias the second current source circuit and the third current source circuit.

7. The charge pump device of claim 6, wherein the bias circuit is configured to simulate connections among the plurality of current source circuits, the first switch, and the second switch, in order to generate the first bias voltage and the second bias voltage.

8. The charge pump device of claim 1, further comprising:
a first transistor configured to receive a bias voltage and coupled between the output node and the first switch; and
a second transistor configured to receive the bias voltage and coupled between the output node and the second switch.

9. The charge pump device of claim 8, wherein each of the first transistor and the second transistor is implemented with the first type of transistor, and each of the second current source circuit and the third current source circuit is implemented with the first type of transistor or the second type of transistor.

10. The charge pump device of claim 8, further comprising:
a third transistor configured to generate a first voltage according to a voltage signal and the bias voltage;
a fourth transistor configured to generate a second voltage according to the voltage signal and the bias voltage;
a third switch configured to be selectively turned on according to a third control signal, in order to output a third voltage to a first node coupled between the first switch and the second current source circuit according to the first voltage, wherein the third control signal and the first control signal have opposite levels;
a fourth switch configured to be selectively turned on according to a fourth control signal, in order to output a fourth voltage to a second node coupled between the second switch and the third current source circuit according to the second voltage, wherein the fourth control signal and the second control signal have opposite levels;
an amplifier circuit configured to generate the voltage signal according to a reference signal;
a resistor coupled to the output node and configured to generate an output signal; and
a capacitor coupled between the resistor and ground.

11. The charge pump device of claim 10, wherein the amplifier circuit operates as a unit gain buffer circuit.

12. The charge pump device of claim 10, wherein the reference signal is the output signal, or a capacitor outputted from the capacitor.

13. The charge pump device of claim 1, wherein the first current source circuit is configured to receive a supply voltage corresponding to the first type of transistor.

14. The charge pump device of claim 1, wherein the first current is equal to the second current and the third current.

15. The charge pump device of claim 1, wherein the first current is higher than the second current and is higher than the third current.

16. The charge pump device of claim 1, wherein when the first switch and the second switch are turned on, a current outputted from the output node is the first current minus a fourth current, and the fourth current is a sum of the second current and the third current.

17. The charge pump device of claim 1, wherein when the first switch and the second switch are not turned on, a current outputted from the output node is the first current.

18. The charge pump device of claim 1, wherein when the first switch is turned on and the second switch is not turned on, a current outputted from the output node is the first current minus the second current.

19. The charge pump device of claim 1, wherein the first current source circuit comprises a first transistor, the second current source circuit comprises a second transistor, the third current source circuit comprises a third transistor, a first terminal of the first transistor is configured to receive a supply voltage, a second terminal of the first transistor is coupled to the output node, a control terminal of the first transistor is configured to receive a first bias voltage, a first terminal of the second transistor and a first terminal of the third transistor are coupled to the output node, a second terminal of the second transistor and a second terminal of the third transistor are coupled to ground via the first switch and the second switch respectively, and a control terminal of the second transistor and a control terminal of the third transistor are configured to receive a second bias voltage.

20. The charge pump device of claim 19, wherein a first terminal of the first switch is coupled to the second terminal of the second transistor, a second terminal of the first switch is coupled to ground, a control terminal of the first switch is configured to receive the first control signal, a first terminal of the second switch is coupled to the second terminal of the third transistor, a second terminal of the second switch is coupled to ground, a control terminal of the second switch is configured to receive the second control signal.

\* \* \* \* \*